United States Patent
Kapaun et al.

(10) Patent No.: US 12,132,384 B2
(45) Date of Patent: Oct. 29, 2024

(54) CURRENT MEASURING CIRCUIT FOR A CONVERTER, CONVERTER CIRCUIT AND CONVERTER

(71) Applicant: Airbus SAS, Blagnac (FR)

(72) Inventors: Florian Kapaun, Taufkirchen (DE); Gerhard Steiner, Taufkirchen (DE)

(73) Assignee: AIRBUS SAS, Blagnac (FR)

( * ) Notice: Subject to any disclaimer, the term of this patent is extended or adjusted under 35 U.S.C. 154(b) by 206 days.

(21) Appl. No.: 17/747,180

(22) Filed: May 18, 2022

(65) Prior Publication Data

US 2022/0376601 A1 Nov. 24, 2022

(30) Foreign Application Priority Data

May 20, 2021 (EP) .................................. 21175096

(51) Int. Cl.
| | | |
|---|---|---|
| *G01R 19/00* | (2006.01) | |
| *G01R 19/165* | (2006.01) | |
| *G01R 31/56* | (2020.01) | |
| *H02M 1/00* | (2006.01) | |

(52) U.S. Cl.
CPC .... *H02M 1/0009* (2021.05); *G01R 19/16571* (2013.01); *G01R 31/56* (2020.01)

(58) Field of Classification Search
CPC ...... G01R 31/52; G01R 31/56; G01R 31/343; G01R 19/16571; H02M 1/0009
See application file for complete search history.

(56) References Cited

U.S. PATENT DOCUMENTS

| | | | |
|---|---|---|---|
| 8,618,753 B2 | 12/2013 | Najima et al. | |
| 8,947,838 B2 | 2/2015 | Yamai et al. | |
| 2001/0048310 A1 | 12/2001 | Takahashi | |
| 2008/0150549 A1* | 6/2008 | Horikoshi | G01R 31/12 324/557 |
| 2010/0128505 A1* | 5/2010 | Leppanen | G01R 19/0092 363/131 |
| 2014/0167779 A1* | 6/2014 | Si | G01R 31/42 324/509 |
| 2015/0256116 A1* | 9/2015 | Tateda | H02M 5/458 318/504 |

(Continued)

FOREIGN PATENT DOCUMENTS

| | | |
|---|---|---|
| CN | 1332211 C | 8/2007 |
| DE | 112014002853 T5 | 3/2016 |

(Continued)

OTHER PUBLICATIONS

European Search Report; priority document.

*Primary Examiner* — Thang X Le
(74) *Attorney, Agent, or Firm* — Greer, Burns & Crain, Ltd.

(57) ABSTRACT

To enable early detection of AC insulation faults, or to permit easier, faster and more accurate measurement of small currents in inverters, a current measuring circuit for a converter is provided. The current measuring circuit has a positive supply rail, a negative supply rail, a reference potential rail and a current measuring device that contains a Y-capacitor and a current sensor connected in series therewith. The load current can be decoupled from the measurement current through the at least one Y-capacitor, so that at high load currents even small fault currents can be acquired reliably with the current sensor.

9 Claims, 1 Drawing Sheet

(56) References Cited

U.S. PATENT DOCUMENTS

| | | | | |
|---|---|---|---|---|
| 2016/0096433 A1* | 4/2016 | Gale | ................. | B60L 3/0069 |
| | | | | 701/34.2 |
| 2018/0057308 A1 | 3/2018 | Kattainen et al. | | |
| 2018/0340971 A1 | 11/2018 | Tamida et al. | | |
| 2020/0081072 A1* | 3/2020 | Hackl | ................. | G01R 31/42 |
| 2020/0136428 A1* | 4/2020 | Zhang | ................. | H02H 3/16 |
| 2022/0373588 A1* | 11/2022 | Maki | ................. | H02P 29/024 |

FOREIGN PATENT DOCUMENTS

| | | |
|---|---|---|
| EP | 3165491 A1 | 5/2017 |
| EP | 3631927 B1 | 5/2021 |
| JP | 6398704 B2 | 7/2016 |

* cited by examiner

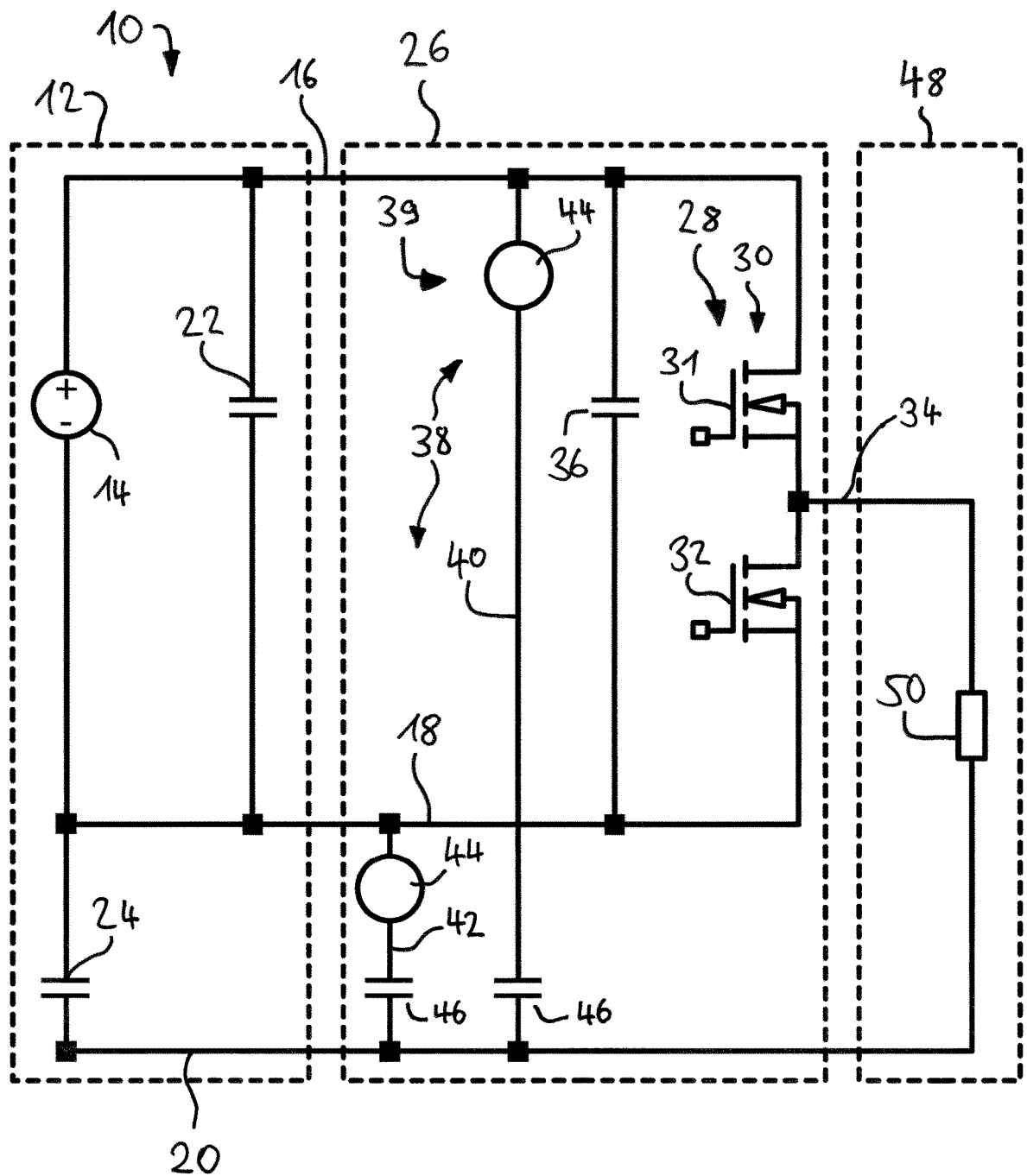

CURRENT MEASURING CIRCUIT FOR A CONVERTER, CONVERTER CIRCUIT AND CONVERTER

CROSS-REFERENCES TO RELATED APPLICATIONS

This application claims the benefit of the European patent application No. 21175096.3 filed on May 20, 2021, the entire disclosures of which are incorporated herein by way of reference.

FIELD OF THE INVENTION

The invention relates to a current measuring circuit for a converter. The invention further relates to a converter circuit, a converter and to further apparatus and methods.

BACKGROUND OF THE INVENTION

U.S. Pat. No. 8,618,753 B2 discloses an inverter in which a measuring shunt is arranged in each phase branch.

JP 6 398 704 B2 and U.S. Pat. No. 8,947,838 B2 each disclose an inverter in which a Y-capacitor is connected in parallel with a DC link capacitor.

SUMMARY OF THE INVENTION

It is an object of the invention to propose measures that improve the measurability of small fault currents in electrical circuits supplied by converters.

The invention creates a current measuring circuit for a converter wherein the current measuring circuit comprises a positive supply rail, a negative supply rail, a reference potential rail and a current measuring device, wherein the current measuring device is connected to each supply rail and to the reference potential rail, and is configured to measure an electrical fault current between a respective supply rail and the reference potential rail.

It is preferred that the current measuring device contains at least one current measuring arrangement that is connected either to the positive supply rail or to the negative supply rail and to the reference potential rail, wherein the current measuring arrangement contains a current sensor and a measuring capacitor connected in series therewith.

It is preferred that the current sensor is connected to one of the supply rails and to the measuring capacitor, wherein the measuring capacitor is connected to the current sensor and to the reference potential rail.

It is preferred that the current measuring device contains a first current measuring arrangement and a second current measuring arrangement, wherein the first current measuring arrangement is connected to the positive supply rail and the second current measuring arrangement to the negative supply rail or vice versa, wherein each current measuring arrangement is connected to the reference potential rail and contains a current sensor and a measuring capacitor connected in series therewith.

It is preferred that the measuring capacitor is configured as a Y-capacitor.

It is preferred that the current measuring device contains a comparator that is configured and connected to detect an overcurrent through the current measuring arrangement.

It is preferred that the current measuring device contains a comparator for each current sensor, wherein a respective comparator is connected to each current sensor.

It is preferred that the current measuring device contains an electrical circuit for measuring the current value, preferably an A/D converter, that is connected to convert an analog fault current flowing through the current measuring arrangement into a digital fault current signal that is indicative for the magnitude of the fault current.

Preferably the current measuring circuit comprises a DC link capacitor that is connected between the positive and the negative supply rail.

It is preferred that the DC link capacitor is connected effectively in series with the current measuring device or with each current measuring arrangement.

The invention provides a converter circuit for a converter, wherein the converter circuit comprises a preferred current measuring circuit and at least one switching device, wherein the switching device is connected between the supply rails and has an electrical output.

It is preferred that the DC link capacitor is arranged closer to the switching device than to any current measuring arrangement.

It is preferred that the converter is configured as an inverter.

The invention creates a current measuring apparatus for a converter, wherein the current measuring apparatus comprises a preferred current measuring circuit.

The invention creates a converter comprising a preferred current measuring circuit and/or a preferred converter circuit and/or a preferred current measuring apparatus.

It is preferred that the converter is configured as an inverter.

The invention creates a current measuring method for ascertaining a fault current caused by an insulation fault in an electrical circuit connected to a converter, in that a current flowing through a capacitor connected between a supply rail of the converter and a reference potential rail of the converter is measured during a switching process of the converter, wherein an insulation fault is assumed if a flow of current through the measuring capacitor that exceeds a predefined threshold value is measured during the switching process.

It is preferred that the converter is configured as an inverter, wherein the current flowing through the measuring capacitor during the positive half-wave and/or during the negative half-wave is measured, wherein an insulation fault is assumed if, during a switching process, a flow of current is measured through the measuring capacitor that exceeds a predefined threshold value.

The invention was made in the technical field of power electronic systems. Their product safety and capacity for fault detection plays a central role. Applications in the electrification of the drivetrain in aircraft in particular demand reliable fault detection.

One fault mechanism is what is known as an AC fault, in which, for example, one phase of a multi-phase inverter or motor suffers an insulation fault that can lead to a malfunction of the drivetrain or of the entire system. The systems are therefore developed to be as failsafe as possible.

According to the ideas presented here, a new method for the detection of AC faults, which is easier to implement, and which is more reliable, is proposed.

The methods known to date are essentially based on measuring the current in each phase of the inverter/motor and forming the sum of all three phases. The result of this summation should be a value close to zero if the AC system is symmetrical.

One difficulty is that the load currents are usually orders of magnitude larger than the fault currents that can arise as a result of asymmetries caused by insulation faults. Detecting small deviations that can be a sign of the beginnings of an insulation problem has therefore until now been complex.

To monitor a deterioration of the insulation, dedicated insulation monitoring systems are usually employed. Because these should react as little as possible to grid noise, these systems usually have a long time constant. The reaction speed is therefore also comparatively low even in the case of larger fault currents.

A further restriction is that the said insulation monitoring systems could until now only be applied to symmetric systems.

A faster and more reliable AC fault detection is enabled through the ideas presented here. Implementation is, in addition, simplified. The proposals can be employed in almost any AC system for the detection of insulation faults in the phase branches. The detection circuit is, furthermore, simpler than with conventional methods.

In the usual measuring methods (for example for symmetrical 3-phase systems) the currents in all three phases L1, L2, L3 are measured separately (for the feedback). The sum IL=IL1+IL2+IL3 of all the currents in the phase branches is then formed. IL=0 in an ideal system with no insulation fault. IL≠0 in the presence of an AC fault.

In reality, IL lies in the range between a few milliamps up to rated current values, so that the detection of small values can be difficult if the measurement is designed for the usual operating points. The majority of systems are, furthermore, not 100% symmetrical.

A different method is instead proposed that does not use the sum of the phase currents for detection. Rather is an additional current sensor—a shunt resistor, for example—connected in series with a Y-capacitor. Under ideal operating conditions, the current through the Y-capacitor is equal to zero. If, however, an AC fault is present, the system becomes unsymmetrical, and a current flows through the Y-capacitor back into the DC link capacitor.

This current can be detected by means of a current sensor (for example, a shunt resistor), and used as a reference for fault detection.

The current here only lies in a small range of values, and can thus be measured more accurately than in the past. The current measurement is made at a non-floating (DC) potential. A simple comparator circuit can be used. Alternatively or in addition, an A/D converter (ADC) can be used for the measurement.

BRIEF DESCRIPTION OF THE DRAWINGS

Exemplary embodiments are explained in more detail below with reference to the appended schematic drawings. Here:

The FIGURE shows an exemplary embodiment of an electrical circuit with an AC fault.

DETAILED DESCRIPTION OF THE PREFERRED EMBODIMENTS

Reference will be made below to the FIGURE, which shows an exemplary embodiment of an electrical circuit 10. The electrical circuit 10 comprises a supplier 12 that comprises a voltage source 14. The voltage source 14 is preferably a DC voltage source. The supplier 12 makes a positive supply rail 16, a negative supply rail 18, and the reference potential rail 20 available. The reference potential rail 20 lies at a reference potential. The reference potential can be ground. The reference potential preferably lies in the middle between the potentials of the positive and negative supply rails 16, 18.

The supplier 12 can furthermore comprise an output capacitor 22. The output capacitor 22 is connected between the positive supply rail 16 and the negative supply rail 18.

The supplier 12 can comprise a capacitance 24 between its lines and a housing lying at reference potential. The capacitance 24 is modelled here as a capacitor. The capacitance 24 can—although it does not have to—be configured as a component of the supplier. The supplier 12 is only shown here to better explain the mode of operation, and can take a wide range of forms that are known per se.

The electrical circuit 10 comprises a converter 26. The converter 26 can be configured as an inverter. The converter 26 contains at least one phase branch 28 with a switching device 30. The switching device 30 comprises two power switches that can be operated in push-pull mode: a first power switch 31 and a second power switch 32. The switching device 30 further comprises an output rail 34. The output rail 34 is arranged between the two power switches 31, 32.

The converter 26 further comprises a DC link capacitor 36 that is connected between the positive supply rail 16 and the negative supply rail 18, and is preferably arranged close to or immediately adjacent to the switching device 30.

The converter 26 further comprises a current measuring circuit 38. The current measuring circuit 38 is connected to both the supply rails 16, 18 and to the reference potential rail 20. The current measuring circuit 38 comprises a current measuring device 39 that is configured to measure a current.

The current measuring device 39 comprises a first current measuring arrangement 40 and a second current measuring arrangement 42. The first current measuring circuit 40 is connected to the positive supply rail 16 and to the reference potential rail 20. The second current measuring device 42 is connected to the negative supply rail 18 and to the reference potential rail 20.

Each current measuring arrangement 40, 42 contains a current sensor 44 and a measuring capacitor 46 connected in series therewith. The current sensor 44 is connected to the respective supply rail 16, 18, while the measuring capacitor 46 is connected to the reference potential rail 20.

The measuring capacitors 46 of each current measuring arrangement 40, 42 are connected as Y-capacitors between the supply rails 16, 18 and the reference potential rail 20. The measuring capacitors 46 can, depending on the particular case, also be part of a set of interference suppression capacitors.

The current sensor 44 can contain a shunt resistor for the current measurement. The shunt resistor is connected in series with the measuring capacitor 46. The current sensor 44 can in addition contain a comparator connected to the shunt resistor for measuring an overcurrent in the respective current measuring arrangement 40, 42. The current sensor 44 can optionally contain an A/D converter for the exact quantification of the overcurrent.

It is assumed below that the electrical circuit 10 has an AC insulation fault 48 that allows unwanted current to flow, and is modelled here by a resistor 50. Other types of AC insulation fault 48 can, however, also be detected. The AC insulation fault 48 can, for example, occur in a supply line system at one or a plurality of terminal devices or in the terminal devices themselves. A fault current is detected as follows When the power switch 31 is switched on, the positive pole of the voltage source 14 is pushed by the AC insulation fault 48 toward the reference potential, for example ground. When the power switch 32 is switched on, the negative pole of the voltage source 14 is pushed by the AC insulation fault 48 toward the reference potential, ground in this case.

This change to the supply voltage in comparison with the reference potential causes a flow of charge carriers through each measuring capacitor 46. This measuring current is then used to ascertain the AC insulation fault 48.

In contrast to the known apparatuses and methods, additional AC insulation faults that only lead to low fault currents can be recognized with the measures described herein. Early detection is thus possible. In addition, through the direct measurement of the current of the measuring capacitors, the measuring current can be decoupled from the actual load current, so that measurements can be taken more easily, quickly and accurately.

To enable early detection of AC insulation faults (48), or to permit easier, faster and more accurate measurement of small currents in inverters (26), a current measuring circuit (38) for a converter (26) is proposed. The current measuring circuit (38) has a positive supply rail (16), a negative supply rail (18), a reference potential rail (20) and a current measuring device (39 that contains a Y-capacitor (46) and a current sensor (44) connected in series therewith. The load current can be decoupled from the measurement current through the at least one Y-capacitor (46), so that even at high load currents even small fault currents can be acquired reliably with the current sensor (44).

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE SIGNS

10 Electrical circuit
12 Supplier
14 Voltage source
16 Positive supply rail
18 Negative supply rail
20 Reference potential rail
22 Output capacitor
24 Capacitance
26 Converter
28 Phase branch
30 Switching device
31 First power switch
32 Second power switch
34 Output rail
36 DC link capacitor
38 Current measuring circuit
39 Current measuring device
40 First current measuring arrangement
42 Second current measuring arrangement
44 Current sensor
46 Measuring capacitor
48 AC insulation fault
50 Resistor

The invention claimed is:

1. A converter circuit configured as an inverter, the converter circuit comprising:
   a current measuring circuit; and
   at least one switching device,
   wherein the current measuring circuit comprises:
      a positive supply rail,
      a negative supply rail,
      a reference potential rail, and
      a current measuring device,
   wherein the at least one switching device is connected between the positive supply rail and the negative supply rail and has an output rail, the current measuring device is connected to each supply rail and to the reference potential rail, and
   wherein the current measuring device is configured to measure an electrical fault current between a respective supply rail and the reference potential rail.

2. The converter circuit for an inverter according to claim 1,
   wherein the current measuring device contains at least one current measuring arrangement that is connected either to the positive supply rail or to the negative supply rail and to the reference potential rail, and
   wherein the current measuring arrangement contains a current sensor and a measuring capacitor connected in series therewith.

3. The converter circuit for an inverter according to claim 2,
   wherein the current sensor is connected to one of the supply rails and to the measuring capacitor, and
   wherein the measuring capacitor is connected to the current sensor and to the reference potential rail.

4. The converter circuit for an inverter according to claim 2, wherein the current measuring device contains a comparator that is configured and connected to detect an overcurrent through the current measuring arrangement.

5. The converter circuit for an inverter according to claim 2, wherein the current measuring device contains a circuit for measuring a current value that is connected to convert an analog fault current flowing through the measuring arrangement into a digital fault current signal that is indicative of a magnitude of the fault current.

6. The converter circuit for an inverter according to claim 1, wherein a DC link capacitor is connected between the positive and the negative supply rails.

7. The converter circuit for an inverter according to claim 6,
   wherein the DC link capacitor is arranged closer to the switching device than any current measuring arrangement.

8. The converter circuit for an inverter according to claim 1, wherein the converter circuit is configured as an inverter.

9. A current measuring method for ascertaining a fault current caused by an AC insulation fault in an electrical circuit connected to a converter, comprising:
   measuring a current flowing through a measuring capacitor connected between a supply rail of the converter and a reference potential rail of the converter, assuming an AC insulation fault if a flow of current that exceeds a predefined threshold value is measured through the measuring capacitor during a switching process, configuring the converter as an inverter, measuring the current flowing through the measuring capacitor during at least one of a positive half-wave or during a negative half-wave, and assuming an AC insulation fault if, during a switching process, a flow of current is measured through the measuring capacitor that exceeds a predefined threshold value.

* * * * *